(12) United States Patent
Tomomatsu et al.

(10) Patent No.: US 7,678,601 B2
(45) Date of Patent: Mar. 16, 2010

(54) METHOD OF FORMING AN ACCELERATION SENSOR

(75) Inventors: Hiroyuki Tomomatsu, Beppu (JP);
Kazuhiko Watanabe, Hayami-gun (JP);
Tetsuya Tada, Hayami-gun (JP);
Toshiyuki Tani, Hayami-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 796 days.

(21) Appl. No.: 11/336,478

(22) Filed: Jan. 20, 2006

(65) Prior Publication Data
US 2007/0172975 A1 Jul. 26, 2007

(51) Int. Cl.
*H01L 21/00* (2006.01)
(52) U.S. Cl. .................. 438/52; 257/418; 257/E21.215
(58) Field of Classification Search .................... 438/52; 257/418, E21.215
See application file for complete search history.

(56) References Cited

U.S. PATENT DOCUMENTS

| 6,210,988 | B1 * | 4/2001 | Howe et al. ................... 438/50 |
| 6,822,304 | B1 * | 11/2004 | Honer ........................ 257/418 |
| 6,917,086 | B2 | 7/2005 | Cunningham et al. |
| 2001/0043028 | A1 * | 11/2001 | Ladabaum .................. 310/334 |
| 2002/0008296 | A1 * | 1/2002 | Chan et al. .................. 257/415 |
| 2003/0036215 | A1 * | 2/2003 | Reid ........................... 438/52 |
| 2003/0215974 | A1 * | 11/2003 | Kawasaki et al. ............. 438/50 |
| 2004/0023429 | A1 * | 2/2004 | Foerstner et al. ............. 438/50 |
| 2004/0157426 | A1 * | 8/2004 | Ouellet et al. ............... 438/618 |

FOREIGN PATENT DOCUMENTS

| EP | 1 350 642 A2 | 10/2003 |
| EP | 1 452 481 A2 | 9/2004 |
| EP | 1 493 712 A2 | 1/2005 |

* cited by examiner

*Primary Examiner*—Steven J Fulk
(74) *Attorney, Agent, or Firm*—Warren L. Franz; Wade J. Brady, III; Frederick J. Telecky, Jr.

(57) ABSTRACT

A method of forming a MEMS structure over active circuitry in a semiconductor body includes forming active circuitry in a semiconductor body, and forming the MEMS structure over the active circuitry, wherein at least a portion of the MEMS structure spatially overlaps the active circuitry.

28 Claims, 5 Drawing Sheets

METHOD OF FORMING AN ACCELERATION SENSOR

FIELD OF INVENTION

The present invention relates generally to micro-electromechanical (MEMS) devices and to a method of fabrication thereof. More particularly, the invention relates to a method of forming a MEMS device such as an acceleration sensor or inertial sensor over active circuitry of an integrated circuit device, thereby minimizing die size.

BACKGROUND OF THE INVENTION

Current trends in the semiconductor and electronics industry require memory devices to be made smaller, faster and require less power consumption. In addition to active circuitry on such integrated circuit devices, micro-electromechanical (MEMS) devices are sometimes employed in various applications. One exemplary application involves aircraft or vehicle applications, where a MEMS device is employed to detect a change in acceleration. In early systems, the active circuitry was manufactured separately from the MEMS device, however, in recent years attempts have been made to integrate the MEMS device and the active circuitry on the same semiconductor substrate, and thus reside in the same package.

Prior art MEMS acceleration sensors consist in some instances of a cantilever type beam extending over an underlying layer with a gap therebetween. As the acceleration of a body associated with the sensor changes, the cantilever bends with respect to the underlying layer, causing a change in the gap distance. By employing the cantilever as one element of a capacitor, the change in gap distance results in a change of capacitance, thereby reflecting the change in acceleration.

Prior art MEMS acceleration sensor systems were not space efficient. That is, the large MEMS portion of the device was fabricated next to the active circuitry employed to detect and communicate the change in capacitance. For example, as illustrated in prior art FIG. 1, an integrated circuit die 10 has a MEMS structure 12 formed next to active circuitry 14, and the MEMS structure 12 occupies a modest amount of die area. This lateral juxtaposition of the MEMS sensor and the active circuitry disadvantageously increases the die size, thereby causing such integrated circuit chips to be rather expensive. Therefore improvements in MEMS sensor devices are desired.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to a method of forming a MEMS structure in a space efficient manner by forming the MEMS structure over active circuitry. The present invention facilitates this efficient use of silicon by forming the MEMS structure with low temperature processing techniques, wherein the formation of the MEMS structure subsequent to the formation of the active circuitry does not substantially affect the electrical characteristics of the active circuitry.

In accordance with one aspect of the present invention, a MEMS structure comprises an acceleration sensor composed of a cantilever type beam arrangement, wherein an upper electrode associated with the beam resides over a lower electrode with a gap defined therebetween, thereby forming a capacitor structure. As a change in acceleration is experienced by the semiconductor body on which the MEMS structure resides, the gap distance changes, thereby altering a capacitance of the capacitor structure. The acceleration sensor is formed over active circuitry (e.g., circuitry associated with the sensor), and is formed using low temperature deposition processing, for example, at temperature less than about 600 C.

According to another aspect of the invention, an acceleration sensor is fabricated over active circuitry, for example, after the formation of transistor devices and after formation of a pre-metal dielectric (PMD) layer with contacts formed therein down to the active circuitry. The formation of the acceleration sensor comprises forming conductive electrode layers with low temperature processing techniques such as sputtering or physical vapor deposition at temperatures less than 600 C. In one example of the invention, an insulative protective layer is formed over the bottom electrode layer, and other insulative protective layers are formed on the top and bottom of the upper electrode layer. In such example, a sacrificial gap layer is formed between the insulative protective layers and comprises aluminum that exhibits a fast deposition rate, thereby efficiently facilitating formation of a thick capacitor gap of, for example, 1-5 microns. Subsequently, the sacrificial gap layer is removed via, for example, a wet etch that is selective with respective to the insulative protective layers to thereby define the gap.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
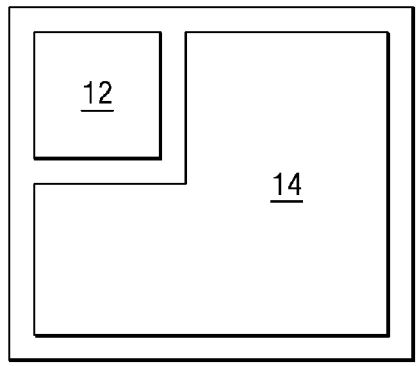
FIG. 1 is a plan view illustrating a prior art integrated circuit die, wherein a MEMS structure is laterally disposed from active circuitry on the die.
Figure 2:
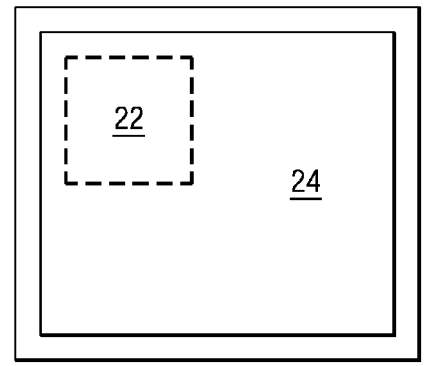
FIG. 2 is a plan view illustrating a MEMS structure according to the present invention, wherein the MEMS structure is formed over the active circuitry on the die and therefore provides a reduction in die size.

The present invention will now be described with reference to the attached drawings, wherein like reference numerals are used to refer to like elements throughout. The invention is directed to a method of forming a MEMS structure such as an acceleration sensor over active circuitry. For example, active circuitry according to the present invention may include a metal circuit wiring layer or multiple wiring layers (e.g., aluminum, titanium tungsten, titanium nitride, tungsten, platinum and/or other conductive materials). The method employs low temperature processing (e.g., less than about 600 degrees-C.) of the MEMS structure, thereby facilitating fabrication of the MEMS structure without substantially affecting electrical characteristics of the active circuitry therebelow. A simplified, plan view of one example of such an integrated circuit device is illustrated in FIG. 2, wherein a device 20 has a MEMS structure 22 (shown in dashed lines) formed over active circuitry 24 according to the present invention. Since the MEMS structure 22 is formed over the active circuitry 24, the MEMS device does not require additional die area, thereby reducing the die size and thus the cost of the integrated circuit device 20.

Turning now to the FIGS. 3-14, FIG. 3 is a flow chart illustrating a method 100 of forming a MEMS structure over active circuitry according to one aspect of the present invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Figure 4:
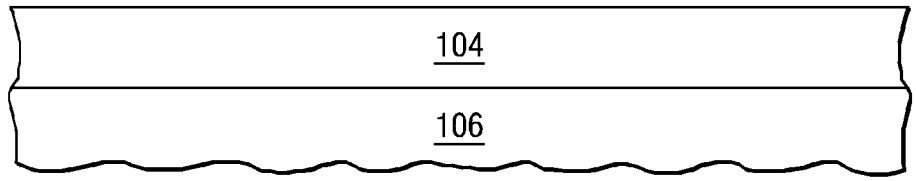
FIGS. 4-14 are fragmentary cross section diagrams illustrating a method of forming an acceleration sensor over active circuitry according to another aspect of the present invention.

The method 100 begins at 102 with the formation of active circuitry 104 in and/or over a semiconductor body 106, as illustrated in FIG. 4. In one example, the semiconductor body 106 comprises a wafer substrate, however, such a body may comprise epitaxial material grown or otherwise formed over insulator material such as SOI material. Any form of semiconductor body may be employed and is contemplated as falling within the scope of the present invention. In addition, in one example the active circuitry 104 comprises circuit devices such as NMOS and/or PMOS transistors, resistors, etc., interconnected in any fashion to form a portion of an integrated circuit. In one particular example, the active circuitry 104 may comprise a portion of the acceleration sensor detection, interpretation and/or communication circuitry that operates in conjunction with the subsequently formed MEMS structure (e.g., acceleration sensor) to receive the change in capacitance data from the MEMS structure. In one example, the active circuitry 104 includes at least a pre-metal dielectric (PMD) layer overlying the circuitry, wherein conductive plugs extend therethrough down to various portions of the circuitry.

Figure 3:
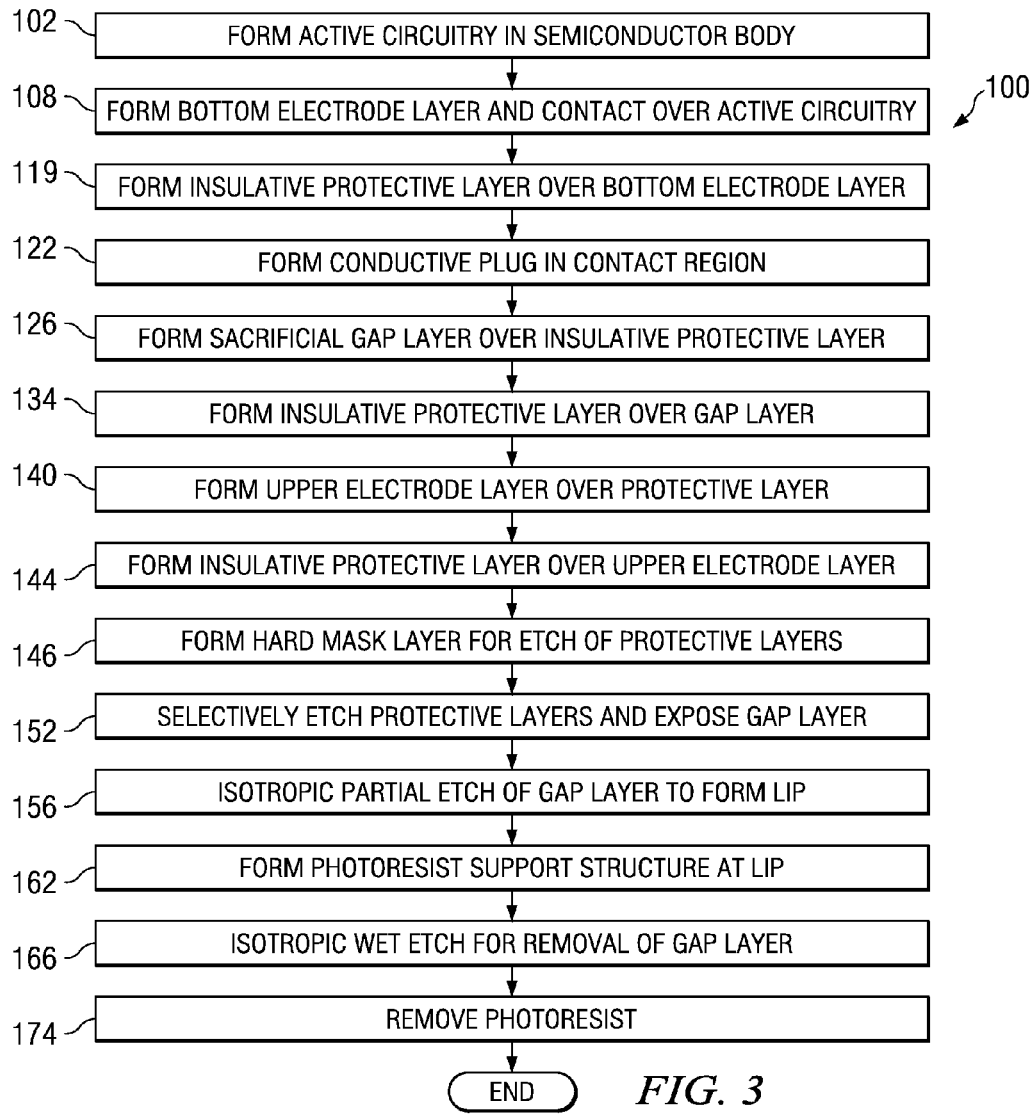
FIG. 3 is a flow chart diagram illustrating a method of forming a MEMS structure over active circuitry according to an aspect of the present invention.
Figure 5:
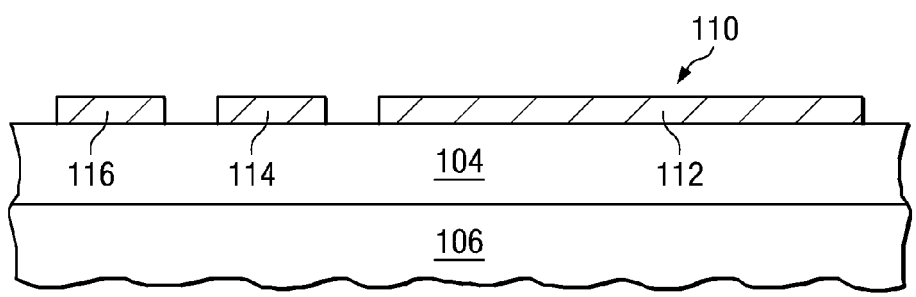

Still referring to FIG. 3, a bottom electrode layer is formed at 108, as illustrated at reference numeral 110 in FIG. 5. In one embodiment of the invention, the bottom electrode layer 110 comprises aluminum and is formed via a low temperature deposition process (e.g., less than about 600 degrees-C.) such as via sputtering or physical vapor deposition (PVD). Alternatively, the bottom electrode layer 110 may comprise titanium tungsten (TiW), titanium nitride (TiN), tungsten (W), or other conductive material conducive to low temperature processing (e.g., less than about 600 degrees-C.). By employing a low temperature deposition process, the underlying active circuitry 104 is not substantially affected by the formation of the bottom electrode layer 110. As further illustrated in FIG. 5, the deposited layer 110 is then etched to form the bottom electrode 112 of the MEMS structure as well as contact structures 114, 116 for connecting to, for example, underlying circuitry.

Figure 6:
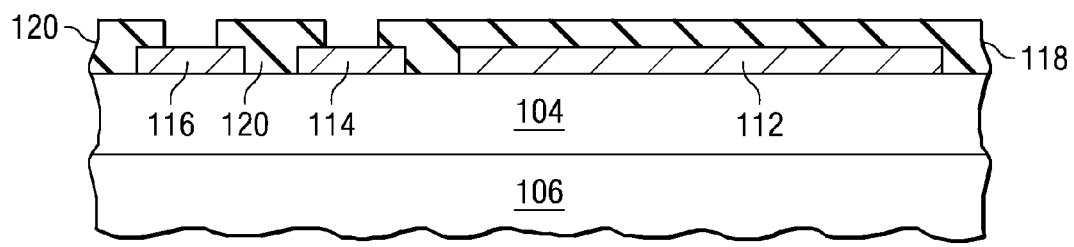

Referring back to FIG. 3, the method 100 continues at 119, wherein an insulative protective layer is formed over the bottom electrode layer 110 and then patterned, as illustrated in FIG. 6 at reference numerals 118, 120. In one embodiment of the invention, the protective layer comprises tetraethyl orthosilicate (TEOS) deposited via a low temperature chemical vapor deposition (CVD) process (e.g., less than about 600 degrees-C.). Alternatively, the protective layer 118, 120 may comprise low temperature plasma deposited silicon nitride (SiN) formed at low temperature (e.g., less than about 600 degrees-C.). Such a formation is substantially different from prior art techniques wherein thermal processes were employed to form layers at temperatures in the range of 600-1200 degrees-C. Such high temperature processing prohibited formation of a MEMS structure after formation of active circuitry since such high temperatures negatively affected, and in some cases damaged, the active circuitry 104. As will be further appreciated infra, the protective layer protects the underlying bottom electrode 112 from corrosion and serves as a highly selective material with respect to the overlying sacrificial gap layer (not yet shown or formed). Consequently, the insulative protective layer 118 facilitates formation of a significant gap for the MEMS structure.

Figure 7:
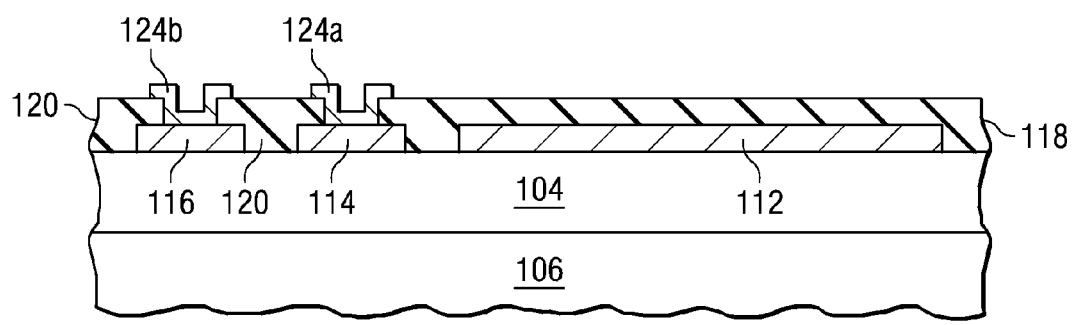

The method 100 of FIG. 3 continues at 122 with formation of conductive plugs 124 in one or more contact regions, as illustrated in FIG. 7. In the illustrated example, one plug 124a will couple an upper electrode (not yet illustrated) down to an underlying portion of the active circuitry 104 while the other plug 124b is illustrated to show that other contact regions may be formed concurrently with the MEMS structure, as may be appreciated. In one example, the conductive plugs comprise titanium tungsten (TiW) and are formed via sputtering or PVD at low temperature (e.g., less than about 600 degrees-C.), however, other conductive materials formed at low temperature may be employed and such variations are contemplated as falling within the scope of the present invention.

Figure 8:
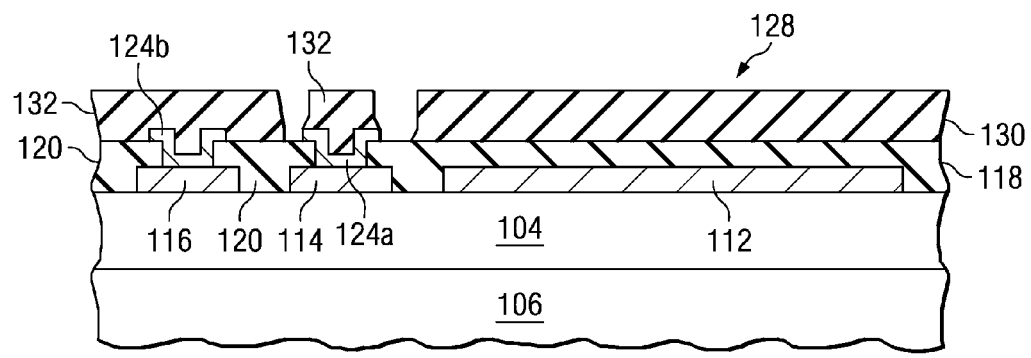

The method 100 of FIG. 3 continues at 126 with the formation of a sacrificial gap layer over the insulative protective layer. For example, as illustrated in FIG. 8, a layer 128 is formed via low temperature processing (e.g., less than about 600 degrees-C.). In one example, the layer 128 comprises aluminum and is formed via sputtering or PVD at a temperature less than about 600 degrees-C., however, the layer may also comprise other materials. Aluminum is particularly advantageous in the present example since it can be deposited via sputtering or PVD at a relatively fast deposition rate of about 1.5 microns/minute. In one example, the thickness of the layer is about 1-5 microns and therefore having a high deposition rate, low temperature process improves throughput. Use of aluminum differs substantially from prior art fabrication techniques that employed thermal oxide or thermal TEOS for such a layer in fabricating a MEMS structure. Such prior art deposition materials and processes are performed at high temperatures (e.g., about 600-1200 degrees-C.) and form at a very slow rate (e.g., about 0.01 micron/minute), which reduces flexibility of construction (e.g., must make gap layer thinner) and reduces throughput. In addition, as will be further appreciated infra, when such layer is later removed (hence the reference to the layer being sacrificial) the etchant employed therein is highly selective with respect to the underlying protective layer, thereby allowing complete removal via overetch of the gap layer without damage to the other layers. The layer 128 is then patterned to form the gap layer 130 over the insulative protective layer 118 and conductive contact regions 132 over the conductive plugs 124, as illustrated in FIG. 8. By forming the aluminum bond pad 132 concurrently with the gap layer 130, a process simplification is advantageously obtained, thereby facilitating reduced cost.

Figure 9:
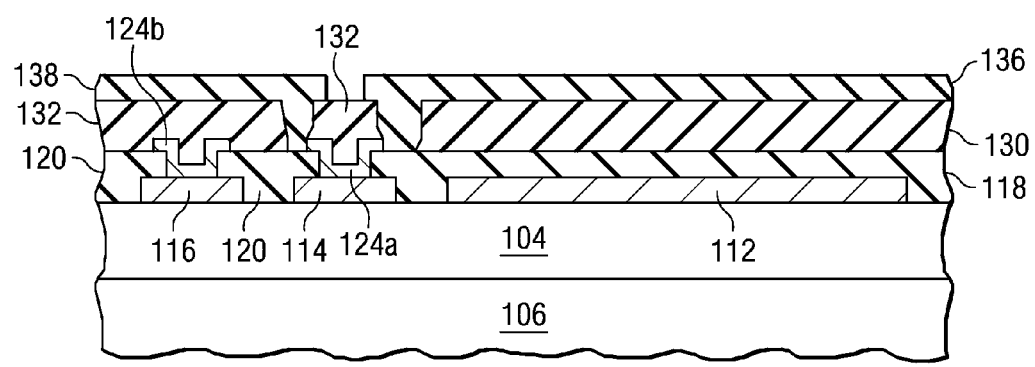

Turning again to FIG. 3, the method 100 continues at 134 with the formation of another insulative protective layer over the gap layer. As will be further appreciated infra, this protective layer forms a lower protective layer for an upper electrode to be subsequently formed. In one example, the insulative protective layer comprises SiN or TEOS, and is formed via a low temperature CVD process of less than about 600 degrees-C. The film is illustrated in FIG. 9 and is subsequently patterned, thereby forming a protective film 136 over the sacrificial gap layer 130, and an insulating film 138 elsewhere.

Figure 10:
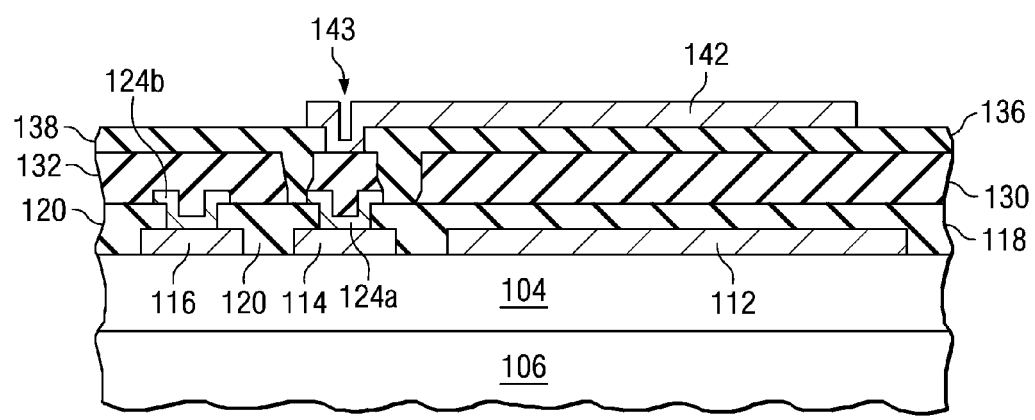

At 140 of FIG. 3 an upper electrode layer 142 is deposited and patterned over the protective layer 136 and makes contact to the conductive contact structure 132 at 143, as illustrated in FIG. 10. In the above manner, the upper electrode of the resultant capacitor is configured to make selective electrical contact down to a component associated with the active circuitry 104 via contact region 114, for example. In one example, the upper electrode layer 142 comprises TiW, however, other conductive materials such as Al, TiN, or W may be employed, and such alternatives are contemplated as falling within the scope of the present invention. In one embodiment, the electrode layer 142 is formed via PVD or sputtering at a low temperature of less than about 600 degrees-C.

Figure 11:
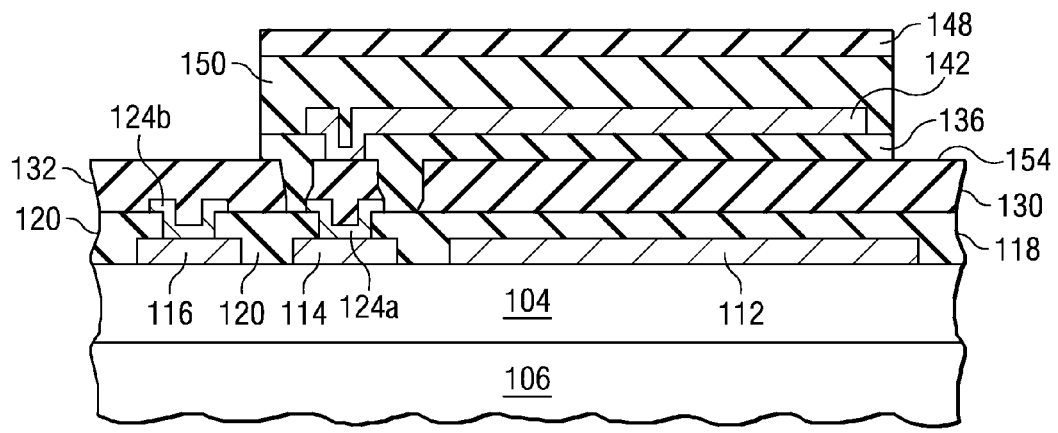

Referring yet again to FIG. 3, another insulative protective layer 150 is formed over the patterned upper electrode at 144, thereby encapsulating the upper electrode in insulative material, as illustrated in FIG. 11. Again, in one embodiment, the additional protective layer comprises SiN or TEOS formed via low temperature CVD (e.g., less than about 600 degrees-C.). A hard mask layer is then formed and patterned over the protective layer at 146 of FIG. 3, and is used to pattern the protective layers at 152 down to the sacrificial gap layer 130. For example, as illustrated in FIG. 11, the hard mask layer 148 is illustrated overlying the insulative protective layer 150 that overlies the upper electrode 142. FIG. 11 illustrates the MEMS structure after etching, using the layer 148 as the hard mask. In one embodiment, the hard mask layer 148 comprises aluminum and thus the etch automatically stops on and exposes a portion 154 of the sacrificial gap layer 130, which in one example is also aluminum. As seen in FIG. 11, the upper and lower protective layers 136, 150 surround and thus encapsulate the upper electrode 142, thereby protecting the upper electrode.

Figure 12:
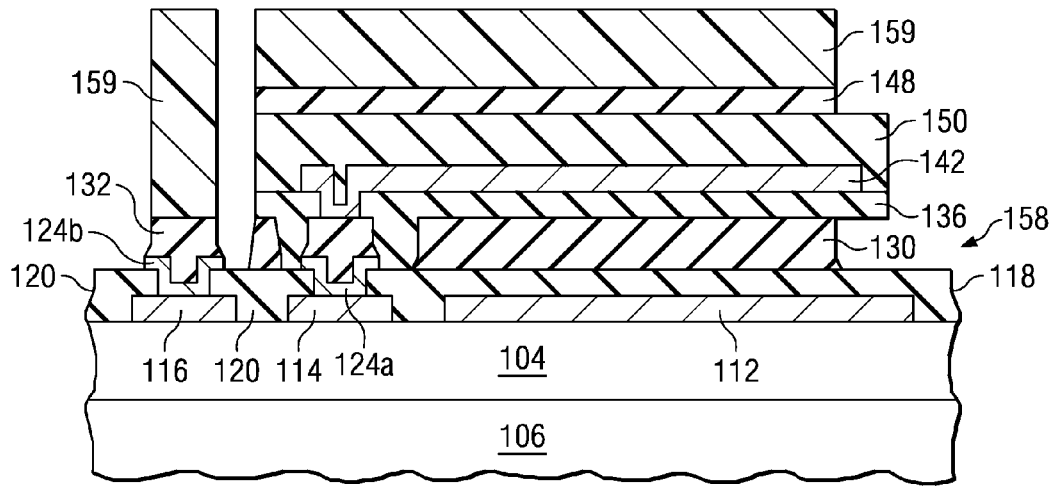
Figure 13:
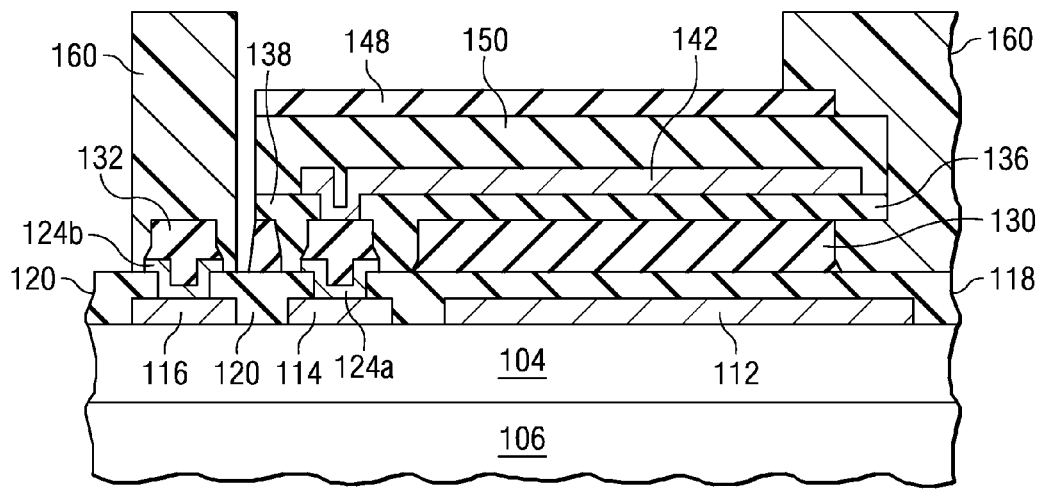

A mask, for example, a photoresist mask 159 is then placed on the hard mask 148 and elsewhere, and an isotropic etch is performed at 156 of FIG. 3 to create an opening or lip 158 in the sacrificial gap layer 130, as illustrated in FIG. 12. The isotropic etch is preferably a wet etch, for example, a mixture of phosphoric acid ($H_3PO_4$) and nitric acid ($HNO_3$), performed at low temperature of less than about 600 degrees-C. (e.g., room temperature). The wet etch is highly selective to the photoresist 159, and either silicon nitride or TEOS, and thus does not affect the protective layers 118, 136 and 150. Another photoresist 160 is then deposited at 162, exposed and developed to mask conductive areas to be retained (for example, the aluminum bond pad overlying structure 116) and also covers and enters the opening or lip 158 (also called the diaphragm), as illustrated in FIG. 13, thereby creating a structural support for the cantilever beam structure composed of the upper electrode 142 and protective layers 136, 150 during a subsequent removal of the sacrificial gap layer 130. As can be appreciated from the above, the photoresist 160 concurrently provides two functions of protecting certain areas and preventing sticking and/or complete removal of material of the gap layer to form the diaphragm. In contrast to conventional solutions that employed thermal silicon oxide or thermal TEOS for the gap layer, that would then necessitate multiple etch steps for removal, the present invention, by employing aluminum or other suitable conductive material for the gap layer, advantageously provides for a process simplification.

Figure 14:
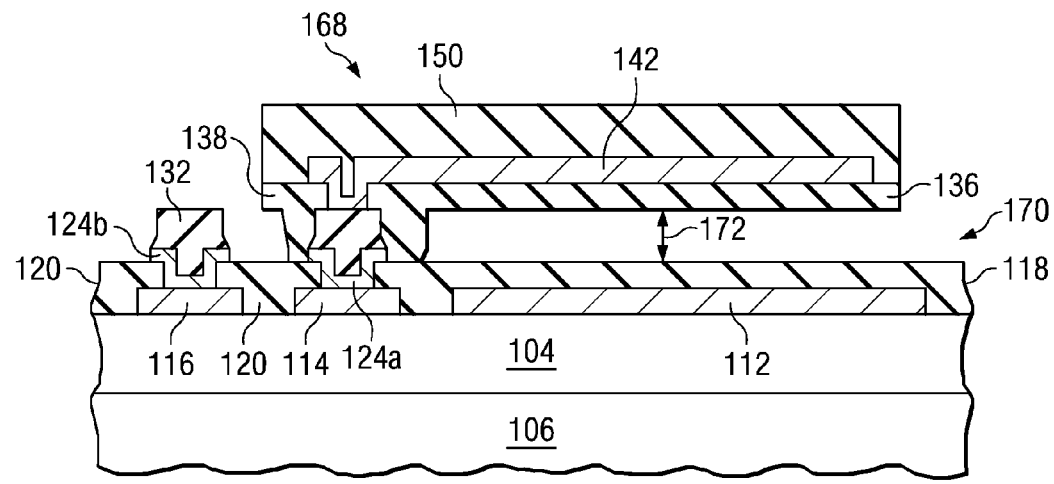

Referring again to FIG. 3, the sacrificial gap layer 130 and hard mask layer 148 are removed at 166 using, for example, a wet etch. In one example, the wet etch comprises $H_3PO_4$+ $HNO_3$, and removes aluminum, yet is highly selective with respect to SiN or TEOS that may be employed for the protective layers 118, 136, 150. The gap layer material is removed because edge portions thereof extending into the page of the drawing are not covered by the photoresist 160, and thus are exposed to the wet etch. Upon removal of the gap layer, a capacitor structure 168 is provided having top and bottom electrodes 142, 112 separated by a gap 170 having a distance 172 associated with the thickness of the gap layer 130 prior to removal thereof, as illustrated in FIG. 14. The photoresist is then removed at 174, for example, using a plasma dry ash. The dry ash removes the resist without any damage to the cantilever beam structure (the exposed plasma silicon nitride or plasma TEOS). As can be seen with the wet etch complete, the lower electrode and the upper electrode are protected by the protective layers, and thus corrosion of the electrodes is prevented.

Figure 15:
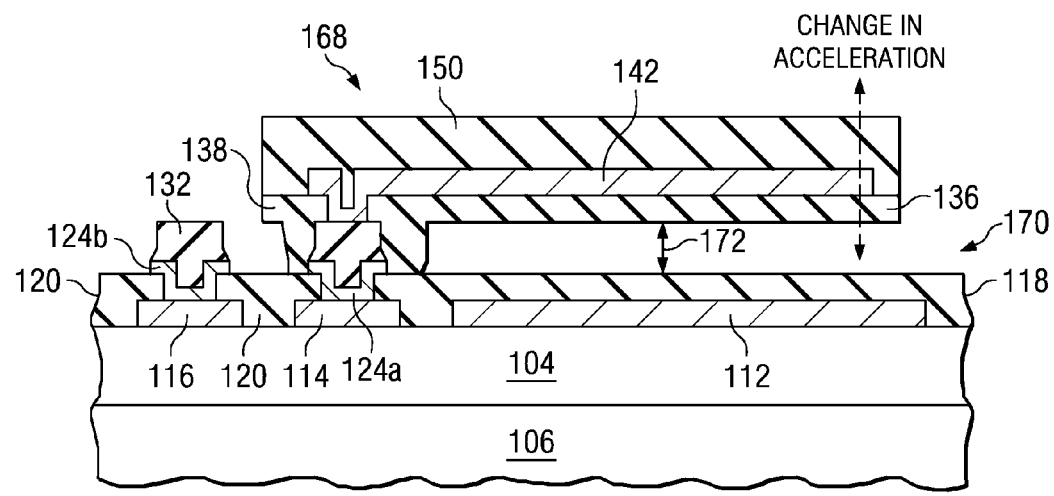
FIG. 15 is a fragmentary cross section diagram illustrating how a change in acceleration of the semiconductor body exerts a force on the MEMS structure, thereby causing a change in the gap distance and thus a change in capacitance of the sensor.

Referring to FIG. 15, when the semiconductor body 106 experiences a change in acceleration, the top cantilever beam portion of the capacitor structure 168 moves, thereby changing the size 172 of the gap 170 between the electrodes. This change in gap size 172 results in a change of capacitance of the capacitor corresponding to the formula:

$$C \sim K(A/d),$$

wherein K is associated with the dielectric constant of the capacitor dielectric (e.g., air, nitrogen, a vacuum (decompression air)), A is associated with the area of the top and bottom electrodes, and d is associated with the gap distance 172.

The present invention advantageously employs low temperature deposition processing in the fabrication of the MEMS structure, thereby allowing the MEMS structure to be formed after the formation of active circuitry. Consequently, the MEMS structure may be formed at least partially (or entirely) over the active circuitry, thereby substantially reduces the die size of the integrated circuit.

Although the present invention has been described above as being formed over active circuitry, the present invention also contemplates formation of the MEMS structure in the above fashion over a wafer, wherein the wafer excludes the active circuitry. For example, if a customer already has an existing active circuitry integrated circuit that senses the electronic signal of a MEMS sensor, the present invention also contemplates a MEMS device that excludes the active circuitry. In that instance, the MEMS device of the present invention may be combined with the existing active circuitry using package technology.

In such an example, the MEMS structure is formed over an insulative layer (e.g., silicon oxide, TEOS, silicon nitride, or BPSG, etc.). Further, in such an example, the MEMS structure comprises three bonding pads, provided for connecting to the upper electrode, the lower electrode, and the wafer substrate. In such an example, the bonding pad for the wafer substrate may be provided for reducing a parasitic capacitance, as may be appreciated.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of forming a MEMS structure over active circuitry in a semiconductor body, comprising:
    forming active circuitry in a semiconductor body, wherein the active circuitry comprises one or more transistor devices; and
    forming the MEMS structure over the active circuitry, wherein at least a portion of the MEMS structure spatially overlaps the active circuitry;
    wherein forming the MEMS structure comprises forming a lower and an upper electrode separated by a gap established by depositing and at least partially removing a sacrificial gap layer comprising aluminum; the lower and upper electrodes being electrically isolated from one another, thereby forming a capacitor structure, wherein a change in acceleration experienced by the semiconductor body causes a change in the gap and thus a change in the capacitance of the capacitor structure.

2. The method of claim 1, wherein the lower and upper electrodes are formed by depositing lower and upper electrode layers at temperatures less than about 600 degrees-C.

3. The method of claim 2, further comprising:
    forming an insulative lower electrode protective layer over the lower electrode with a deposition process having a temperature less than about 600 degrees-C.; and
    forming a first insulative upper electrode protective layer under the upper electrode with a deposition process having a temperature less than about 600 degrees-C.

4. The method of claim 3, further comprising forming a second insulative upper electrode protective layer over the upper electrode with a deposition process having a temperature less than about 600 degrees-C.

5. The method of claim 3, wherein the lower electrode layer comprises aluminum; and the insulative lower electrode protective layer comprises plasma TEOS.

6. The method of claim 5, wherein the first insulative upper electrode protective layer comprises plasma silicon nitride.

7. The method of claim 2, wherein the lower electrode layer comprises aluminum; and the upper electrode layer comprises TiW.

8. The method of claim 1, wherein the lower electrode comprises aluminum.

9. A method of forming an acceleration sensor, comprising:
    forming active circuitry in a semiconductor body; and
    forming the acceleration sensor over the active circuitry, wherein the acceleration sensor spatially overlaps at least a portion of the active circuitry, and forming the acceleration sensor further comprises:
        forming a lower electrode layer over the active circuitry;
        forming a sacrificial gap layer over the lower electrode layer;
        forming an upper electrode layer over the sacrificial gap layer; and
        patterning the electrode layers and at least partially removing the sacrificial gap layer, thereby leaving a gap having a distance associated with a thickness of the gap layer between lower and upper electrodes;
    wherein forming the acceleration sensor includes forming contact structures for the underlying active circuitry laterally displaced from the electrodes concurrently with the forming of the sacrificial gap layer.

10. The method of claim 9, wherein the sacrificial gap layer formed over the lower electrode layer includes forming a sacrificial gap layer comprising aluminum over the lower electrode layer; and forming the contact structures includes forming an aluminum bond pad.

11. The method of claim 9, further comprising forming a conductive contact laterally spaced from the lower electrode layer and making electrical contact between the active circuitry and the upper electrode layer.

12. The method of claim 9, wherein forming the acceleration sensor is performed at temperatures less than about 600 degrees-C.

13. The method of claim 9, further comprising forming a bond pad associated with the active circuitry and an electrical contact for the upper electrode layer concurrently with the forming of the lower electrode layer by forming a conductive layer and patterning the conductive layer to define the lower electrode layer, the bond pad, and the electrical contact, respectively.

14. A method of forming an acceleration sensor, comprising:
    forming active circuitry in a semiconductor body; and
    forming the acceleration sensor over the active circuitry;
    wherein the acceleration sensor spatially overlaps at least a portion of the active circuitry;
    and forming the acceleration sensor comprises:
        forming a conductive lower electrode layer by sputtering or physical vapor deposition at a temperature less than about 600 degrees-C.;
        forming an insulative lower electrode protective layer over the lower electrode layer with a chemical vapor deposition process at a temperature less than about 600 degrees-C.;
        forming a conductive sacrificial gap layer over the insulative lower electrode protective layer with a deposition process having a temperature less than about 600 degrees-C.;
        forming a first insulative upper electrode protective layer over the sacrificial gap layer with a chemical vapor deposition process at a temperature less than about 600 degrees-C.;
        forming a conductive upper electrode layer over the first insulative upper electrode protective layer by sputtering or physical vapor deposition at a temperature less than about 600 degrees-C.;

forming a second insulative upper electrode protective layer over the upper electrode layer with a chemical vapor deposition process at a temperature less than about 600 degrees-C., wherein the first and second insulative upper electrode protective layers encapsulate the upper electrode layer;

patterning the first and second insulative upper electrode protective layers to expose the sacrificial gap layer; and at least partially removing the sacrificial gap layer, thereby defining a gap between the insulative lower electrode protective layer and the first insulative upper electrode protective layer;

wherein forming the acceleration sensor includes forming contact structures for the underlying active circuitry concurrently with the forming of the sacrificial gap layer.

15. The method of claim 14, wherein the conductive lower electrode and the conductive upper electrode each comprises one of aluminum, titanium tungsten, titanium nitride, and tungsten.

16. The method of claim 14, wherein the insulative lower electrode protective layer comprises one of TEOS and silicon nitride.

17. The method of claim 14, wherein the first and second insulative upper electrode protective layers each comprises one of TEOS and silicon nitride.

18. The method of claim 14, wherein the sacrificial gap layer comprises aluminum.

19. The method of claim 18, wherein removing the sacrificial gap layer comprises performing a wet etch that is selective with respect to the insulative lower electrode protective layer and the first and second insulative upper electrode layers.

20. The method of claim 14, wherein patterning the first and second insulative layers comprises:

forming a patterned aluminum hard mask layer over the second insulative upper electrode protective layer; and etching the first and second insulative upper electrode protective layers using the patterned aluminum hard mask layer as an etch mask.

21. The method of claim 20, wherein removing the sacrificial gap layer comprises:

removing an edge portion of the sacrificial gap layer after etching the first and second insulative upper electrode protective layers, thereby defining an edge lip portion of an upper electrode assembly;

depositing and patterning a photoresist layer at the edge lip portion, thereby forming photoresist adjacent the sacrificial gap layer under the edge lip portion of the upper electrode assembly; and removing the sacrificial gap layer with a wet etch that is selective with respect to the first and second insulative upper electrode protective layers and the insulative lower electrode protective layer.

22. The method of claim 21, wherein the photoresist layer also covers a bond pad portion, and thereby concurrently protects the bond pad portion during the removal of the sacrificial gap layer.

23. The method of claim 21, further comprising removing the photoresist layer after removing the sacrificial gap layer with a plasma dry ash, wherein the plasma dry ash does not substantially affect the insulative electrode protective layers.

24. A method of forming MEMS structure over active circuitry in a semiconductor body, comprising:

forming active circuitry in a semiconductor body; and forming the MEMS structure over the active circuitry, wherein at least a portion of the MEMS structure spatially overlaps the active circuitry, and forming the MEMS structure includes forming a lower electrode layer, a first protective layer over the lower electrode layer, an aluminum sacrificial layer over the first protective layer, a second protective layer over the aluminum sacrificial layer, and an upper electrode layer over the aluminum sacrificial layer by processes not exceeding 600 degrees-C.; and patterning and etching the thus formed layers to define upper and lower electrodes separated by a gap established by removal of at least portions of the aluminum sacrificial layer.

25. The method of claim 24, wherein forming the aluminum sacrificial layer and subsequent patterning also establishes aluminum contact structures for connecting to underlying circuitry.

26. The method of claim 25, wherein the lower electrode layer comprises aluminum.

27. The method of claim 26, wherein the first protective layer and the second protective layer each comprises a plasma deposited one of TEOS or silicon nitride.

28. The method of claim 27, wherein the first protective layer comprises TEOS, the second protective layer comprises silicon nitride, and the upper electrode layer comprise TiW.

* * * * *